United States Patent
Gomez

(10) Patent No.: US 7,127,708 B2
(45) Date of Patent: Oct. 24, 2006

(54) CONCURRENT IN-SYSTEM PROGRAMMING OF PROGRAMMABLE DEVICES

(75) Inventor: Joseph J. Gomez, Naperville, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 610 days.

(21) Appl. No.: 10/109,083

(22) Filed: Mar. 28, 2002

(65) Prior Publication Data

US 2003/0187629 A1    Oct. 2, 2003

(51) Int. Cl.
G06F 9/44     (2006.01)
G06F 15/00    (2006.01)

(52) U.S. Cl. ............... 717/139; 717/127; 717/131; 712/37

(58) Field of Classification Search ........ 717/124–139; 702/118, 120, 119, 186; 714/726, 724; 326/40; 709/217; 345/763; 712/37
See application file for complete search history.

(56) References Cited

U.S. PATENT DOCUMENTS

| | | | | |
|---|---|---|---|---|
| 6,134,707 | A * | 10/2000 | Herrmann et al. ........... | 717/139 |
| 6,219,785 | B1 * | 4/2001 | Smith ............................ | 713/1 |
| 6,259,271 | B1 * | 7/2001 | Couts-Martin et al. ....... | 326/40 |
| 6,314,550 | B1 | 11/2001 | Wang et al. ................... | 716/17 |
| 6,668,237 | B1 * | 12/2003 | Guccione et al. ........... | 702/119 |
| 2001/0056558 | A1 * | 12/2001 | Couts-Martin et al. ..... | 714/726 |
| 2003/0014206 | A1 * | 1/2003 | Gorodetsky et al. ........ | 702/118 |
| 2003/0033374 | A1 * | 2/2003 | Horn et al. .................. | 709/217 |
| 2003/0078752 | A1 * | 4/2003 | Allamsetty .................. | 702/120 |
| 2003/0101022 | A1 * | 5/2003 | Shah et al. .................. | 702/186 |
| 2003/0132964 | A1 * | 7/2003 | Santori et al. .............. | 345/763 |
| 2003/0140291 | A1 * | 7/2003 | Brown et al. ............... | 714/724 |

OTHER PUBLICATIONS

Brunham et al., Run-Time Reconfiguration: TOwards Reducing the Density Requirements of FPGAs, Electrical and Computer Engineering, Canadian Conference on, May 13-16, 2001, vol. 2, pp. 1259-1264.*
Chiakang et al., A silicon efficient FLEX 6000 programmable logic architecture, Proceedings of the IEEE, May 11-14, 1998, pp. 273-276.*
Reese et al., A 6.9 ns, 560 macrocell, in system programmable, CMOS PLD with 3.3-5 volt I/O capability, Proceedings of the IEEE, May 11-14, 1998, pp. 265-268.*
Brian Rooks, The man-machine interface get friendlier at Manufacturing Week, Proquest.com, 1998. vol. 25, Iss. 2; p. 112.*
Thomke, Managing experimentation in the design of new products, proquest.com, Jun. 1998. vol. 44, Iss. 6; p. 743, 20 pgs.*
Stewart et al., Semiconductor Component Testing, proquest.com, Feb. 1988. vol. 27, Iss. 2; p. 36.*

* cited by examiner

Primary Examiner—Wei Zhen
Assistant Examiner—Satish S. Rampuria

(57) ABSTRACT

A method for programming of a plurality of programmable devices arranged in a JTAG boundary scan chain takes advantage of knowledge of a target system. The method speeds device programming and reduces system memory requirements. Raw data is extracted from high-level files. The raw data is stored in the target system. JTAG boundary scan chain information is coded into device programming software. Alternatively, the JTAG chain information is stored as data in the target system. The device programming software treats JTAG I/O registers of the programmable devices as concatenated shift registers. Data packets are assembled that include, for example, a byte of programming information, for each of the devices. The packets are shifted through into the JTAG chain. Bytes of the packet are aligned with, and loaded into, respective devices. Optionally, the validity of data loaded is checked by comparing it to the stored raw data. Invalid data is reprogrammed.

18 Claims, 5 Drawing Sheets

CONCURRENT IN-SYSTEM PROGRAMMING OF PROGRAMMABLE DEVICES

BACKGROUND OF THE INVENTION

The invention is related to the art of programmable devices and more specifically to the art of programming programmable devices in-system. The invention will be described in reference to devices that are compliant with "IEEE Standard 1149.1-1990, IEEE Standard Test Access Port and Boundary Scan Architecture", published by the Institute of Electrical and Electronics Engineers and incorporated herein by reference in its entirety. However, those of ordinary skill in the art will understand that the invention can be applied wherever devices can be programmed over a serial chain.

Many devices, such as, for example, complex programmable logic devices CPLDs, microprocessors, micro-controllers, coprocessors, programmable controllers, sequencers, graphics controllers, memories such as DRAMS, SRAMS, EPROMS, serial EPROMS, flash memories, programmable logic devices (PLDs), and field programmable gate arrays (FPGAs) can be programmed in-system via associated JTAG (Joint Test Action Group) ports (see IEEE Standard 1149.1-1990). Many of these devices are based on non-volatile technologies and therefore, need only be programmed or configured once. According to the IEEE Standard 1149.1-1990, multiple devices can be chained through these ports so that a plurality of devices on a JTAG chain can be accessed for programming and validation. This protocol facilitates in-system programming.

In-system programming of devices is preferable to pre-programming of such devices, before they are installed into a system, because of the apparent disadvantages of pre-programming. For example, pre-programming involves more handling steps. Each extra handling step increases the risk of damaging a device, due to, for example, electro-static discharge (ESD), pins bending, and pin breakage. Pre-programming equipment represents increased capital expenditure. Where similar devices are programmed in different ways, pre-programming requires extra steps or procedures to ensure that only devices programmed appropriately are installed in associated locations in the target system. Of course, extra manufacturing steps require extra manpower and, therefore, additional manufacturing costs.

In-system programming eliminates these disadvantages and has additional advantages. At initial power-up, at the end of a target system manufacturing process in a system designed for self in-system programming, an on-board processor can run a JTAG query and determine that associated programmable devices on a JTAG boundary scan chain are blank. The detection of blank devices triggers an automatic programming procedure. Since the devices are already installed in the system and since the programming procedure programs the devices according to their location in the system, it is guaranteed that a device in a given location is programmed or configured with the appropriate information for that location.

One advantage of this procedure is that the devices need only be handled once, to install them in the system. This is in contrast to procedures that rely on pre-programming, wherein devices must be installed in a programming device, removed from the programming device and then installed in very specific locations in the system based on the programming the devices received.

Another advantage of in-system programmability is that devices can be easily reprogrammed even after they are sold and installed out in the field. For example, as will be described in greater detail below, by updating the contents of a non-volatile memory including programming or configuring information used by the programming procedure, the devices can be automatically updated without the need for extra programming equipment and without returning the system to the factory.

Referring to FIG. 1, currently available systems 110 and related techniques for self-programming in-system devices in target systems 112 include using a development tool to generate an industry standard, high level file referred to as a JEDEC file 114. The JEDEC file 114 contains information about how a device is to be programmed or configured. In the case of, for example, CPLDs, a Serial Vector Format (SVF) file 118 is generated from the JEDEC file using a conversion utility. For example, the device manufacturer (e.g. Xilinx) provides a utility called "jtagprog" 122. The SVF file 118 defines how a JTAG TAP controller of a processor 126 is to be manipulated and what data is to be transferred to a device during programming. The SVF file 118 is substantially ASCII text. The SVF file format is useful where in-system programming is done with and external device temporarily connected to a target system 112. In in-system self-programming environments, the information contained in the SVF files would have to be included in the target system 112. However, the ASCII text format of SVF files is not very efficient and would require too many target system resources (e.g. memory or storage space). Therefore, it has become common to compress SVF files to a format called Xilinx Serial Vector Format (XSVF) 130 using another utility. For example, one manufacturer provides a utility called "svf2xsvf" 134 to perform this transformation. XSVF files are in a compressed binary format, which can be more easily stored in target system hardware. Before storage into an EPROM, for example, the XSVF files 130 may be converted into yet another format, such as, for example, Intel Hex. Each device 140 to be programmed in and by the target system 112 must have its own associated XSVF file 130. Therefore, the required storage space can still be prohibitive.

With currently available self programming, in-system technology, a target system processor 126, such as a microprocessor or a micro-controller, then uncompresses or decodes the XSVF file and executes equivalent routines to those of the temporarily connected SVF based external device.

In-system programming or configuration can be triggered by an external demand or could be triggered by some internal event such as hardware power-up and initialization. In order to ensure that devices are programmed correctly, they are often re-programmed at every power-up. This can create a problematic delay in device operation and devices are reprogrammed even when reprogramming is not required. Alternatively, a verification type SVF file can be generated and stored for execution on the target system. However, again due to the memory requirements needed to store these verification SVF files, it is often not practical to store them on the non-volatile memory of the target system and verification is not performed.

One way to verify that the devices in a target system have already been programmed and, therefore, do not need to be programmed is to examine the value stored in a particular location in the device and compare it to a verifying value. For example, many devices include a User Register that can be loaded with a version number, checksum, or other verification or identification information. Whenever an associated value stored in, for example the non-volatile memory of the target system, does not match the value programmed in, for example, the User Register of the programmable device, the programmable device can be selectively reprogrammed. If the value stored in the User Register matches or otherwise correlates to the associated value stored in the non-volatile memory of the target system, the device is determined to have been programmed correctly and re-programming is avoided.

A problem with User Register or similar schemes is that the device might have been partially programmed such that the user register information has been programmed into the device, but the rest of the data was not. In this case, when the device's user register is accessed, its value will match, but the device can be non-functional.

Another problem with currently available self-programming, in-system programming or configuration technology is the time it takes to program each device. For example, in an exemplary target system using an 80C51 microcontroller running at 16 Mhz, it takes approximately 13 seconds to program an XC95144XL CPLD. It is not unusual to find four or more of these devices in a target system. With currently available in-system self-programming technology, the devices are programmed one at a time. So, if a target system includes four devices, it will take approximately 52 seconds to program four devices. This is problematic in a manufacturing environment, for example, because no device testing or other procedures can be performed while device programming or configuration is taking place. In a field environment, where re-programming is used instead of device verification, the user must wait during a boot-up period before being able to use the target system. This can be annoying is some instances, and make the target system unusable in others.

For the foregoing reasons, it has been desired to provide a method of in-system programming or configuration that has a reduce demand on target system resources, improves device programming or configuration speed and provides a method of thorough verification that does not place an undue burden on system resources.

SUMMARY OF THE INVENTION

A method of configuring a plurality of similar interconnected programmable devices in a target system has been developed. The method includes extracting at least one set of low level data from one or more high level configuration files, each high level configuration file and set of low level data being associated with at least one of a plurality of similar programmable devices included in the target system, storing the at least one of set of low level data in the target system, encoding device chain or interconnection information in a data packet assembly software module included in the target system, assembling a data packet based on the encoded interconnection information and a portion of each of the at least one of set of low level data, and shifting each of the assembled data packets through the interconnected devices, thereby loading the portions of low level data into associated programmable devices.

One aspect of the invention is a system useful for configuring a plurality of similar interconnected programmable devices.

In some embodiments, the method of configuring a plurality of similar interconnected programmable devices is a method of configuring a plurality of similar programmable devices interconnected in a JTAG boundary scan chain in a target system. The method includes extracting a at least one set of low level data from at least one high level configuration files, each high level configuration file and set of low level data being associated with at least one of a plurality of similar programmable devices included in a target system, storing the at least one of set of low level data in the target system, encoding JTAG chain information in a data packet assembly software module included in the target system, assembling a data packet based on the encoded JTAG chain information and a portion of each of the at least one of set of low level data, and shifting each of the assembled data packets through the JTAG boundary scan chain, thereby loading the portions of low level data into associated programmable devices.

Optionally, the method can include shifting data out of the plurality of devices over the JTAG chain and comparing the data from the plurality of devices with associated portions of the at least one of set of low level data to determine a validity of the data from the plurality of programmable devices.

For example, if the data from the plurality of programmable device is invalid, the method can further include reassembling a data packet based on the JTAG chain information, the associated portions of the at least one set of raw data; and shifting the reassembled data packet through the JTAG boundary scan chain, thereby reloading the portion of the at least one of set of raw data into the plurality of programmable devices.

In some embodiments, the method of configuring a plurality of similar interconnected programmable devices is a method of configuring a plurality of similar programmable devices interconnected in a JTAG boundary scan chain in a target system, wherein the method includes extracting a first set of raw data from a first SVF file associated with a first programmable device, storing the first set of raw data in read only memory included in the target system, storing JTAG chain information describing the interconnections of the similar programmable devices, reading the stored JTAG chain information, reading a portion of the first set of raw data, assembling a data packet based on the read JTAG chain information, and the portion of the first set of raw data, and shifting the assembled data packet through the JTAG boundary scan chain, thereby loading the portion of the first set of raw data into at least one programmable device.

Storing JTAG chain information can be achieved by hard coding the JTAG chain information in device configuring software included in the electronic device.

Alternatively, storing JTAG chain information is achieved by storing the JTAG chain information in read only data memory included in the electronic device.

Extracting a first set of raw data from a first SVF file can include creating an XSVF file from the SVF file data, and extracting the raw data from the XSVF file.

Optionally, the method of configuring a plurality of similar programmable devices includes extracting a plurality of sets of raw data from a plurality of SVF files associated with a plurality of programmable devices, storing the plurality of sets of raw data in read only memory included in the electronic device reading a portion of the each of the plurality of sets of raw data, wherein assembling a data packet further includes assembling the data packet based on the portions of each of the plurality of sets of raw data and shifting the assembled data packet through the JTAG boundary scan chain, thereby loading the portion of the first set of raw data into at least one programmable device and loading the portions of each of the plurality of sets of raw data into respective programmable devices.

Advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various procedures and arrangements of procedures. The drawings are only for purposes of illustrating a preferred embodiment(s) and are not to be construed as limiting the invention. Further, it is to be appreciated that the drawings are not to scale.

DETAILED DESCRIPTION

Development of embodiments of the invention was facilitated by several observations related to at least some JTAG boundary chain compatible devices. First, a program bit stream associated with the observed JTAG boundary chain compatible devices contains fixed size address, data and command words. For example, see <device>.adrs and <device>.bsd files supplied by the programmable device manufacturer Xilinx. Second, the JTAG protocol provides for status bits that allow the status of an address being programmed to be fed back to a device performing programming supervision. Therefore, the supervising device can determine that programming has been successful before attempting to program a next location. Third, the address scheme of at least some devices is not linear. However, the address schemes can be determine and algorithms can be written to correctly generate device addresses. Fourth, after an address location has been programmed successfully, repeatedly reprogramming the address location with the same data is of no consequence. For example, device performance or service life is not adversely affected. Fifth, a significant delay or a wait time (measured in microseconds) is associated with the programming of each address location. (Some devices delay after a number of addresses (block) have been loaded into the device.). When multiplied by the rather large number of address locations to be programmed in a particular device, this delay can be significant. Sixth, the instructions sequence sent to a device to program, erase, verify user code, is always the same and is readily determined.

Another observation is that programming data can be determined by generating an SVF file for programming the device, using, for example, manufacture supplied development tools such as, the "jtagprog" 122 program. The development tool can be used to generate an SVF file as if the device in question is the only device in the chain. This eliminates a great deal of file overhead describing the chain relationship of other devices in the target system. This simplified SVF file contains an instruction sequence and programming data. The programming data can be easily identified and classified as address information, data, and commands. From here, the data can be extracted or stripped out. We refer to this extracted data as raw or low level data.

Figure 1:
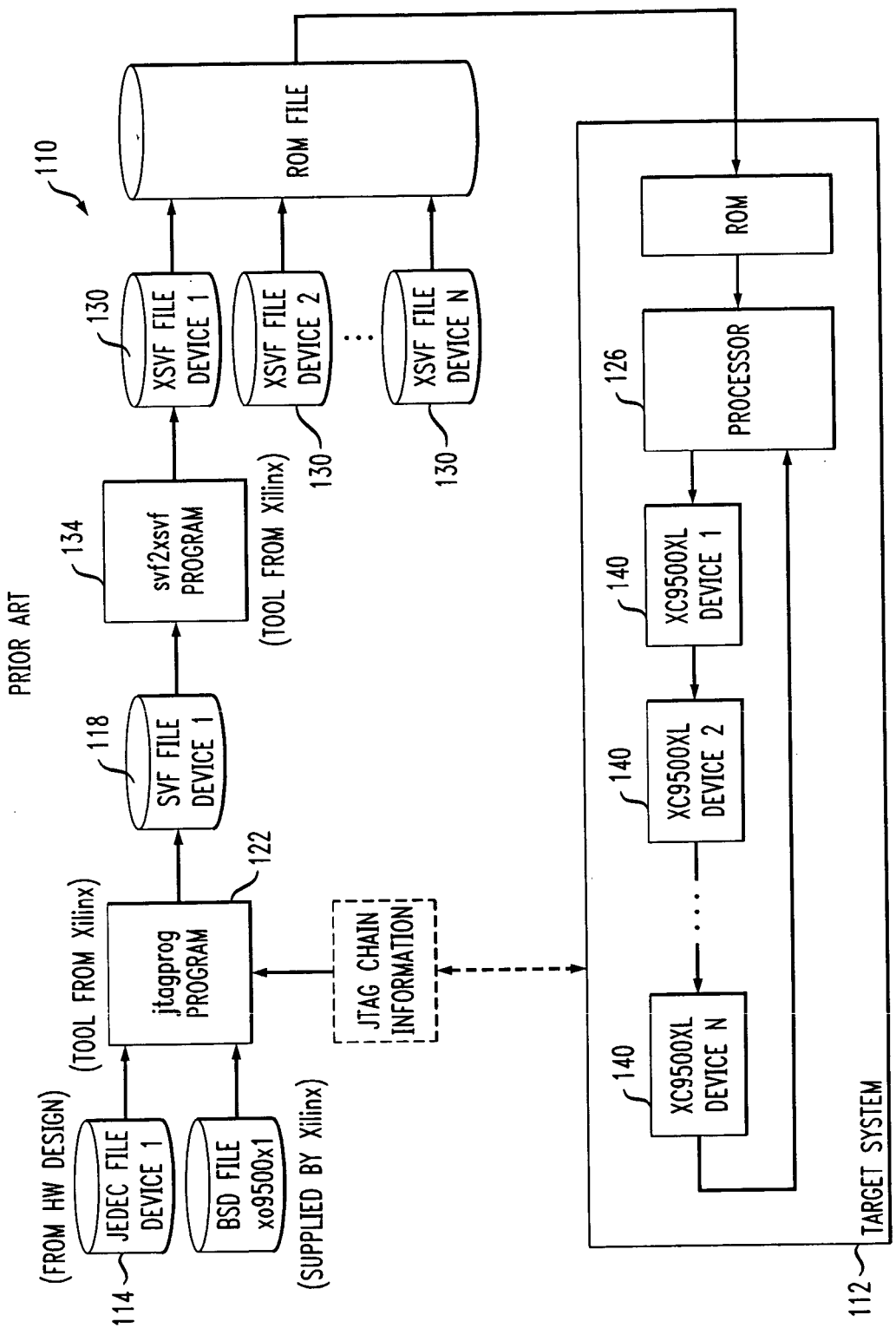
FIG. 1 is a flow diagram illustrating a prior art method for loading high level files into a target system to be used in self in-system sequential device programming.
Figure 2:
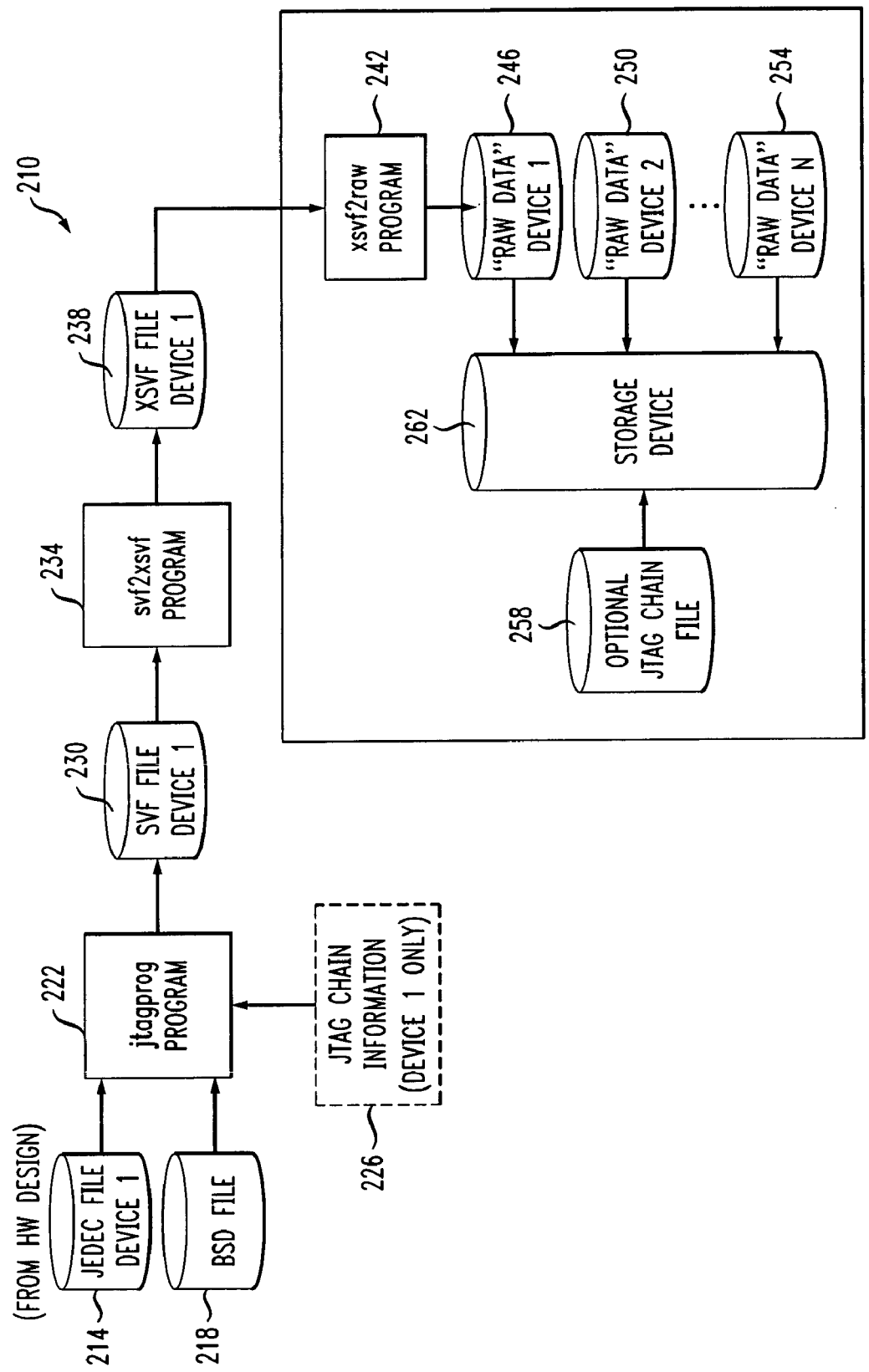
FIG. 2 is a is a flow diagram illustrating a method operative to load low level or raw data into a target system to be used in self in-system concurrent device programming.

Referring to FIG. 2, a technique for configuring a plurality of similar programmable devices interconnected in a JTAG boundary scan chain uses an arrangement 210 for determining or extracting raw, or low level, or machine language data from high level configuration files and storing the raw or low level data in a target system being manufactured. As explained above, programmable device manufacturers, such as manufacturers of microprocessors, microcontrollers, coprocessors, programmable controllers, sequencers, graphics controllers and memories such as DRAMS, SRAMS, EPROMS, Serial EPROMS, flash memories, programmable logic devices (PLD), field programmable gate arrays (FPGA) and complex programmable logic devices (CPLD), provide development tools for generating high level configuration or program files. Third parties also make development tools available. The high level files these tools generate include information that allows generic or mass produced programming tools or systems to be used to program or configure the programmable devices. For example, one kind of high level file generated by a wide range of development tools is in a format established by the Joint Electron Device Engineering Counsel (JEDEC). Files of this type are known as Jedec files 214. In the case of programmable devices that are also compatible with the JTAG boundary scan chain protocol, programmable device manufacturers provide a boundary scan device file 218 that contains descriptive information about the device. In the case of, for example, CPLDs, programmable device manufacturers provide additional conversion utilities. For example, one utility called JTAGPROG 222 combines information from a Jedec file 214 and a BSD file 218, and optionally a JTAG chain information file 226, to create a Serial Vector Format file (SVF) 230. The SVF file is largely an ASCII text file. Among other things, the SVF file defines how a JTAG TAP controller is to be manipulated during device programming. Additionally, the SVF file 230 specifies bit streams or data packets to be shifted out a JTAG port while programming devices, or what incoming bit streams to expect during device program verification. SVF files are most useful when external or off board systems, such as, for example personal computers, are used to program devices on target systems.

However, with the advent of self in-system programmability, it has become desirable to store the information found in SVF files directly in target systems that include the devices to be programmed. However, since SVF files are text-based, they are generally larger than can be reasonably accommodated in target systems. Therefore, compression utilities have been developed. For example, an SVF2XSVF program 234 converts SVF files to a binary XSVF 238 file format.

Preferably, low level or raw data is extracted from high level configuration files in the XSVF file format. However, it is to be understood that low level, raw, or machine language data can be extracted from any kind of high level configuration file, including but not limited to Jedec files 214 and SVF files 230.

A low level, raw data or machine language extraction utility scans a high level configuration file, such as, for example, the XSVF file 238, the SVF file 230 or the Jedec file 214 for portions containing low level, raw or machine language data. For example, where the high level configuration file is an SVF file 230, the extraction program 242 scans the file for scan data register (SDR) commands. These commands are associated with low level, or raw data values that represent the program or configuration information for a particular location in a particular device. When the extraction program 242 locates raw data, it copies or extracts the information and builds a set of raw data 246 associated with a device to be programmed. Optionally, this process is repeated for additional files 250, 254 associated with additional devices. The sets of raw data 246, 250, 254 are stored in a storage device 262 associated with an electronic device being manufactured. Optionally, JTAG chain information 258 is stored in a similar manner to the raw data 246, 250, 254.

Figure 3:
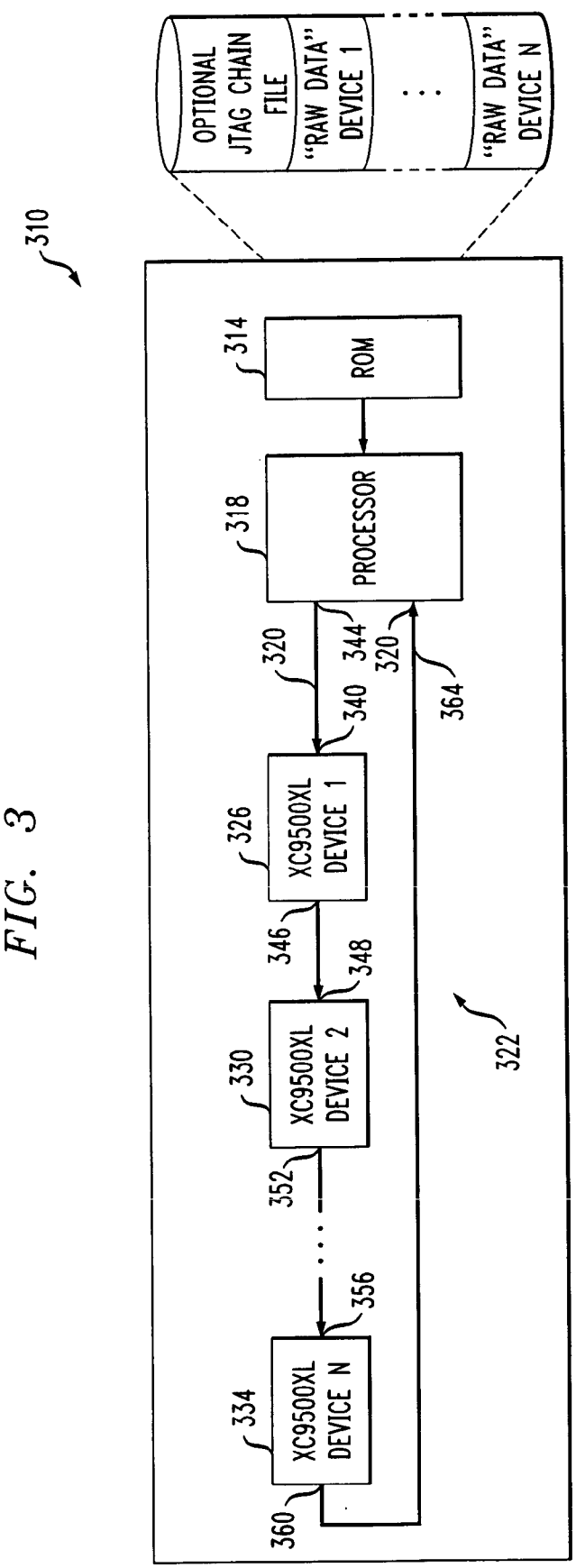
FIG. 3 is a front view of an exemplary target system.

For example, referring to FIG. 3, in an exemplary target system 310, the storage device 262 is a read only memory (ROM) 314. The ROM can be an EEPROM, an EPROM, a flash memory, or any other solid-state memory device. In other electronic devices, the storage device 262 might be a hard drive, a CD ROM drive, or a floppy disc drive. In the exemplary device 310, the ROM is in communication with a processor 318. The processor 318 can be any computational device such as, for example, a microcontroller, a microprocessor, a digital signal processor, a coprocessor, or any other device that can execute device-programming software. The processor 318 includes a JTAG port 320. The JTAG port 320 is connected to a JTAG boundary scan chain 322 of programmable devices 326, 330, 334. Devices 326, 330, 334, in the chain 322 are all similar. For example, the devices 326, 330, 334, all have the same address space. Any one of the devices 326, 330, 334, can be programmed or configured in a unique manner. Alternatively, one or more of the devices 326, 330, 334 can be programmed with the same information as any of the other devices in the chain. Each device 326, 330, 334 includes registers for receiving data. The registers have inputs and outputs and can be configured to allow data to pass through the registers and out an associated JTAG port.

The first programmable device 326 is connected, at a JTAG input port 340, to a JTAG output port 344 of the processor 318. A JTAG output port 346 of the first device 326 is connected to a JTAG input port 348 of the second device 330. A JTAG out port 352 of the second device 330 is connected to a JTAG input port 356 of the third device 334. A JTAG output port 360 of the third device 334 is connected to a JTAG input port 364 of the processor 318. As data is shifted out of the output port 344 of the processor 318, it flows through a selected register in the first device 326 into a similar selected register of the second device 330 and then into a selected register of the third device 334. By shifting enough data to fill the three registers, the processor can concurrently load the three devices with information. Similarly, by requesting information from each device and shifting an appropriate number of bits through the JTAG boundary chain 322, the processor 318 can read information from each device.

With the raw data stored as described above, and programmable devices interconnected to each other and to a computational device, as described above or in a similar manner, a program can be written for the computational device 318 to allow it to concurrently erase, program, and verify the devices (e.g. 326, 330, 334).

Each device with unique programming data will have an associated set of raw or low level data (devices with the same data can share the same raw data thus further minimizing the required storage space, such as for example, non-volatile memory needed for storage). Devices that are similar have the same address space. This means that the program address of all the devices being programmed are the same and that address pointers of the programmable device can be initialized and updated in lock step. Since reprogramming the same location with the same data has no consequence, the program address is not changed to the next location until all devices report that a current address location has been successfully programmed. If need be, data packets are retransmitted and data is reloaded into devices until all the devices in a chain have been successfully programmed. All devices are erased and programmed at the same time. Other devices on the JTAG chain that are not being programmed can be placed in bypass mode. Data is simply shifted through them as if they were not in the chain. Since the JTAG chain is static, the chain configuration can be hard-coded in the programming algorithm so there is no need to store the chain configuration with the raw data.

The raw data (e.g. 246, 250, 254) stored in the target system (e.g. 310) can also be used to verify the information programmed in the devices. As described above, verification can also be done concurrently with data being shifted from all the similar devices in a JTAG boundary scan chain.

If a bit is corrupt in one device, the related address of all the similar devices in a chain can be re-programmed. Although this may seem impractical, when programming devices concurrently, the time it takes to program one device is the same as the time to program all the devices. Alternatively, the properly programmed devices are placed in bypass mode. However, switching to bypass mode in some devices may unnecessary slow the programming process.

During programming, since there is a wait delay for each address location or range of address locations being programmed, preferably, this wait time is used to assemble the next data packet.

Figure 4:
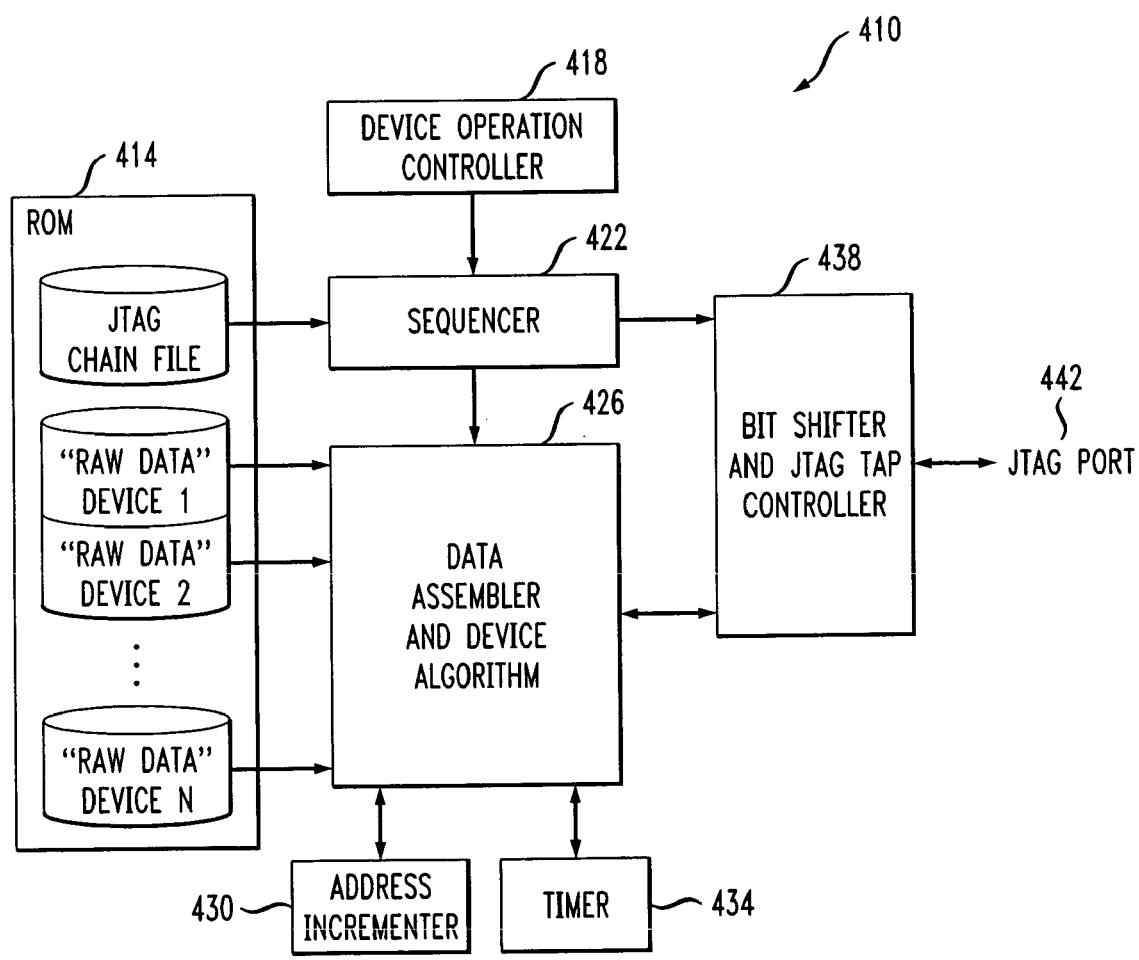
FIG. 4 is a block diagram of a device operative to perform self in-system concurrent programming of associated programmable devices.

Referring to FIG. 4, a device 410 operative to concurrently configure or program similar programmable devices that are installed in a target system, such as, for example, the target system 310 discussed above, includes a storage device 414, a device operation controller 418, a sequencer 422, a data packet assembler 426, an address incrementer 430, a timer 434, a bit shifter and JTAG TAP controller 438, and a JTAG port 442. For example, the device 410 can be implemented substantially in software run by a processor such as processor 318. The processor can be dedicated to the purpose of programmable device configuration or can perform other tasks, such as, for example supervising the main purpose or function of a system such as target system 310. Alternatively, the device 410 can be implemented in hardware, for example, as a state machine, as will be understood by those of skill in the art.

As explained above, the storage device 414 can be any kind of storage device, such as, for example, rotating media or solid-state memory. Preferably the storage device is a read only memory (ROM), such as, for example, one or more Flash memory integrated circuits or EPROM. The storage device is loaded with one or more sets of low level or raw data, such as for example, machine code. Optionally, the storage device 414 is also loaded with JTAG boundary scan chain information describing the types and relative location of the programmable devices to be programmed.

The device controller 418 supervises the device programming or configuration operation. Optionally, the device controller 418 supervises device configuration or program verification. The device controller 418 determines schedules and coordinates the details of the programming or configuration operation. For example, the device controller 418 coordinates device erasure, programming and verification through the services of the sequencer 422.

The sequencer 422 controls the JTAG operations to be performed on the devices. For example, the sequencer 422 is coded with knowledge of the JTAG chain configuration or it reads the JTAG chain information optionally stored in the storage device 414. The sequencer 422 has access to the JTAG controller so that it can perform basic TAP control functions such as RESET, Shift-IR, and Shift-DR state transitions and insert JTAG commands in the JTAG port 442 data stream. In this regard, the sequencer 422 also commands the data assembler 426 to include appropriate JTAG instructions or low level or raw data in a data packet to be shifted into the JTAG chain (e.g. 322) through the JTAG port 442.

The data assembler 426 substantially implements the methods of the present invention in the concurrent programming and verification system 410. The data assembler 426 is hard coded based on knowledge of how the programmable devices in the JTAG boundary scan chain (e.g. 322) are programmed, erased, and verified. However, in the illustrated embodiment, the data assembler 426 is not hard coded based on knowledge of where the programmable devices are located in the chain. As indicated above, the data assembler 426 receives commands from the sequencer 422 which indicate what is to be done in regard to a specified device (e.g. one of 326, 330, 334), such as, for example, assembling an erase instruction, programming data, register by-pass instruction, etc. for the specified device. The data assembler 426 responds by adding appropriate information in the appropriate location in a data packet being assembled.

The address incrementer 430 provides device (e.g. 326, 330,334) address information to the data packet assembler 426. For example, the data packet assembler 426 uses this information in selecting appropriate portions or bytes of low level or raw data to be included in the data packet being assembled, or to keep track of a current address that is being programmed in the programmable devices. In this regard, the address incrementer 430 may include an address generation algorithm for the target devices. An address generation algorithm may be needed where programmable device addressing is not linear.

The timer 434 provides timing information to the data packet assembler 426 and or the bit shifter and JTAG TAP controller 438. For example, the timing information is used by the data assembler 422 to provide required time delays during device erasure and/or programming or to schedule packet assembly operations.

The bit shifter and JTAG TAP controller 438 receives commands and data from the sequencer 422 and the data packet assembler 426 respectively. The bit shifter and JTAG TAP controller 438 controls or adds JTAG commands at appropriate points in the JTAG port data stream. For example, the bit shifter and JTAG TAP controller 438 may insert a TAP state machine transition request into the data stream. For instance, a TAP state machine transition request involves toggling TCK and TMS signals on the JTAG port. Additionally, the bit shifter and JTAG TAP controller 438 coordinates shifting data bits out and/or receiving and storing incoming bits. This procedure involves toggling TCK and TDI signals appropriately when reading-in TDO state information and storing it to memory.

Figure 5:
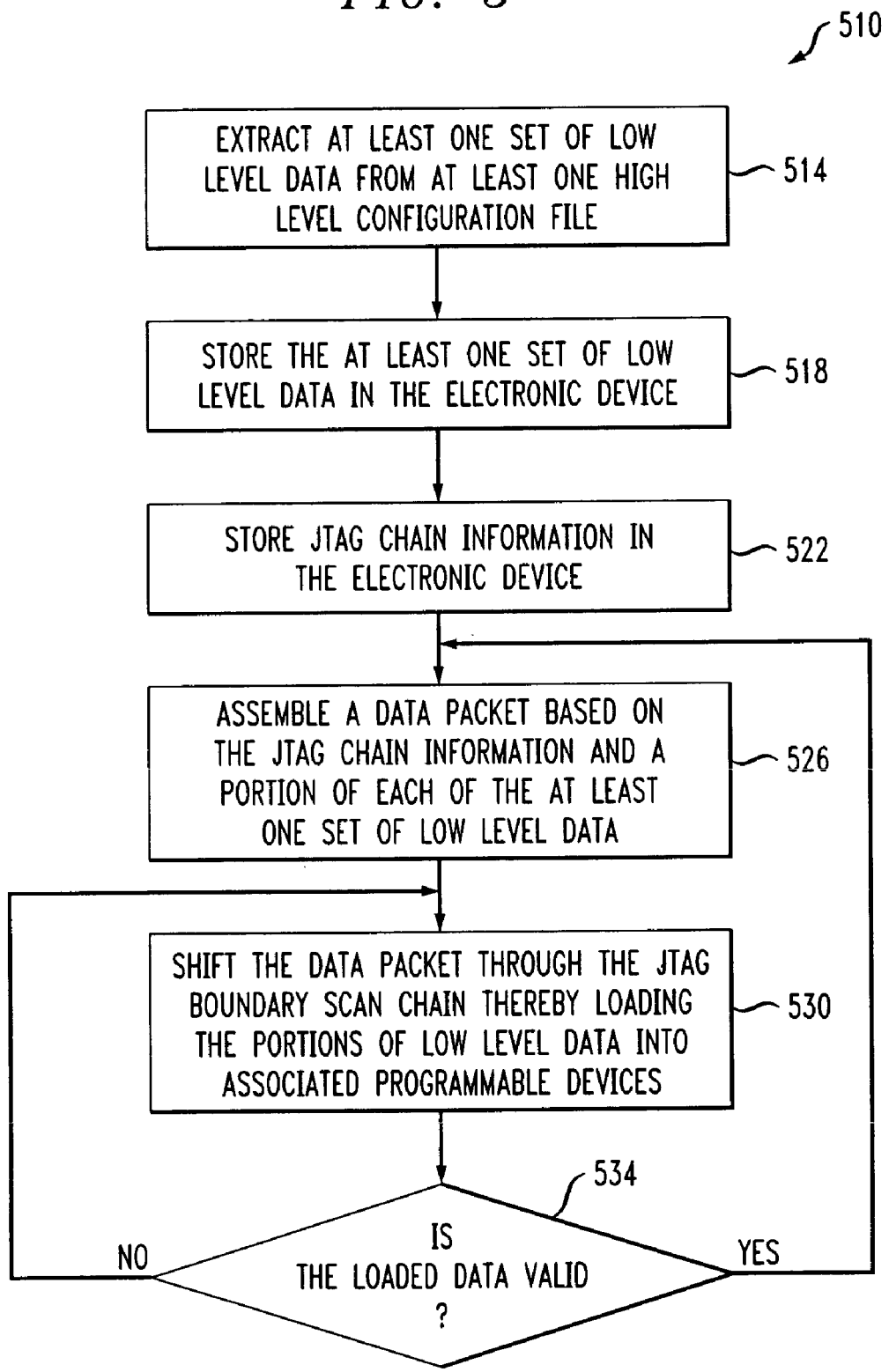
FIG. 5 is a flow diagram summarizing a method of programming or configuring a plurality of similar programmable devices interconnected in a JTAG boundary scan chain.

In summary, referring to FIG. 5, a method 510 for configuring a plurality of a similar programmable device interconnected in a JTAG boundary scan change includes extracting 514 at least one set of low level data from at least one high level configuration file, storing 518 the at least one set of low level data in the electronic device, storing 522 JTAG chain information in the electronic device, assembling 526 a data packet based on the JTAG chain information, and a portion of each of the at least one sets of low level data and shifting 520 the data packet through the JTAG boundary scan chain, thereby loading the portions of low level data into associated programmable devices.

As explained above, development tools such as, for example, compilers and device configuration software, generate files that include information that allows programming and configuring tools to program and configure a wide variety of devices on a wide variety of platforms. However, the system developer that has prior knowledge of what devices will be included in a system, how those devices will be physically arranged, and how those devices will be used, can customize device programming and configuration software. Such customization renders a great deal of the information stored in the high level configuration files that are output by the development tools, extraneous and/or redundant. Therefore, extracting 514 at least one set of low level data from at least one high level configuration file includes separating device programming or configuring information from device description information, address information, and command information included in the high-level configuration files typically generated by development tools. For example, where development tools provide serial vector format files (SVF files), extracting low level data includes extracting only hexadecimal program information from the Scan Data Register (SDR) commands in the SVF file.

By extracting and storing 514, 518 only this low level information the system designer is saved from the burden of having to provide storage space for the redundant information stored in an SVF file. Because the system designer has prior knowledge of the details of his system the system designer is saved from having to provide space to store disable test reset line commands, instruction register scans, data register scans, header data register and header instruction register commands, instruction register trailer commands, data register trailer commands, run/test commands, and so on and so forth. Instead, where needed, these commands are inserted by the custom programming and configuring software. For example, appropriate commands are inserted during the assembling 526 of a data packet and/or during the shifting 530 of the data packet through the JTAG boundary scan chain.

With additional reference to FIG. 2, preferably, low level data 246, 250, 254 is preferably extracted 514 from high level configuration files when the high level configuration files are in the XZVF 238 file format. Extracting information from XSVF files is preferable because XSVF files are in a binary format and therefore closer to the form desired for storage in the target system 310.

As mentioned above, while the invention is being described in terms of JTAG chains, SVF files and XSVF files, it is understood that low level programming and configuration information can be extracted from files of other formats and the invention is applicable to other kinds of device interconnection schemes. Such extractions and applications are to be considered equivalent to those described here.

A target system, such as that depicted in FIG. 3, can include a plurality of similar programmable devices. Each programmable device can be programmed or configured in a unique way or in a way that is identical to (or matching) the configuration of other devices of the plurality. Preferably, one set of low level data is extracted for each unique configuration. Where a number of programmable devices are to share a configuration, the same set of low level data is used repeatedly while assembling 526 the programming or configuring data packet. In this regard, one set of low level or raw data can be associated with a plurality of programmable devices.

The low level or raw data can be stored in a target electronic device in any known electronic storage device. For example, if the electronic device includes rotating media such as a hard drive CD-ROM or floppy disc drive the low level data can be stored there. Preferably, the raw, or low level data, is stored in a solid state device, such as, for example, a read-only memory device. Electrically erasable programmable read-only memory (EEPROM), erasable programmable read-only memory (EPROM) and flash memory are commonly used as types of solid state read-only memory.

Optionally, JTAG boundary chain information is stored 522 along with the low level data. Preferably, however, the JTAG boundary chain information is encoded in the commands and program flow of device programming or configuring software 410 included in the electronic device.

Upon initial power-up, for example, at a manufacturing facility of the target system, or upon a detection of an error in one or more of the programmable devices, the device programming or configuring software is activated. The programming or configuring software assembles 526 a first data packet. For example, for each programmable device 326, 330, 334 a portion or a byte of data is selected from each of the stored sets of low level data 246, 250, 256. For instance, where a target system includes four similar programmable devices and wherein the second and fourth similar device in a boundary scan chain can be programmed or configured with the same information from a first set of low level or raw data, and where a third programmable device is to be programmed from a second set of raw data, and a first programmable device is to be programmed from a third set of raw data, a packet is assembled by selecting a first byte from the first set of raw data, a first byte from the second set of raw data, a second copy of the first byte of the first set of raw data and a first byte from the third set of raw data. For example, the bytes are concatenated in the recited order. Additionally, appropriate JTAG boundary scan commands are included in the data packet for, for example, erasing data from the programmable devices, placing the devices in a mode to receive new programming information, and to appropriately initialize address or program location registers of the devices.

Once the data packet is assembled 526, the programming or configuration software shifts 530 the data packet through a serial JTAG boundary scan chain into the similar devices on the JTAG boundary scan chain. When the entire packet has been shifted out of the JTAG port the portion or byte from the first set of raw data in the example above, is loaded into the fourth programmable device. The byte or portion of the second set of raw data is loaded into the third device. The copy of the byte or portion from the first set of raw data is loaded into the second programmable device and the byte or portion from the third set of raw data is loaded into the first programmable device.

Optionally, data written to the programmable devices can be read back out through the JTAG chain. The validity of this data can be verified 534 by comparing it to the raw or low level data that was used to assemble the data packet. If the data from one or more of the programmable devices does not match the raw or low level data, the data packet can once again be shifted 530 out through the JTAG port in an attempt to load the data in the programmable devices correctly. If the loaded data is valid, and there is additional data to be loaded, a new data packet is assembled 526.

Those of ordinary skill in the art will understand that the order of some of these procedures can be changed. For example, the validity of loaded data might not be checked at all. Alternatively, the assembly and shifting procedures 526, 530 may be repeated until all of the raw or low level data has been loaded. The validity of the loaded data can then be checked. Whenever the low level data is found to be invalid, the data packet associated with that data can be reassembled and shifted back out through the JTAG port to reconfigure or properly configure the programmable devices.

As mentioned in the background section, to program the exemplary four devices using a prior art method takes 52 seconds (13 seconds to program each device). Using the method 510 of concurrent programming, programming the exemplary four devices takes 13 seconds. And additional 3 seconds is consumed during optional program verification. Therefore, a total of only 16 seconds is required to program and verify all four exemplary devices. This is a dramatic reduction in configuration or programming time. In addition, in system storage requirements (for XSVF files etc.) of the prior art system are 90K bytes compared to 52K bytes for storing the raw data of the concurrent method 510 disclosed here. Additionally, the concurrent programming method 510 provides bit-by-bit verification on the programmable devices.

The following equations show the programming time advantage of concurrent programming. The only overhead is the time to verify each device. This Verification is an optional operation and even when it is used, it only has a marginal impact on total processing time.

Let "N" be the number of same type devices to be programmed in the JTAG chain.

Let "tp" be the time to program one device.

Let "tv" be the time to verify all the devices concurrently in the chain.

Let "T" be the total time to program all "N" devices.

User registration access is negligible.

For Prior Art Programming:

$$T = N \times tp$$

For Concurrent Programming:

$$T = tp + tv$$

The invention has been described with reference to particular embodiments. Modifications and alterations will occur to others upon reading and understanding this specification. It is intended that all such modifications and alterations are included insofar as they come within the scope of the appended claims or equivalents thereof.

I claim:

1. A method of configuring a plurality of similar interconnected programmable devices in a target system, the method comprising:

extracting at least one set of low level data from at least one high level configuration file, each high level configuration file and set of low level data being associated with at least one of the plurality of similar interconnected programmable devices included in a target system;

storing the at least one set of low level data in the target system;

encoding interconnection information regarding the interconnected programmable devices in a data packet assembly software module included in the target system;

assembling a data packet based on the encoded interconnection information and a portion of each of the at least one of set of low level data; and shifting the assembled data packet through the interconnected programmable devices according to the interconnection information, thereby loading the portions of low level data into associated programmable devices concurrently.

2. The method of configuring the plurality of similar interconnected programmable devices of claim 1 further comprising:

shifting data out of the plurality of devices; and comparing the data from the plurality of devices with associated portions of the at least one set of low level data to determine a validity of the data from the plurality of interconnected programmable devices.

3. The method of configuring the plurality of similar interconnected programmable devices of claim 2 further comprising:

if the data from the plurality of interconnected programmable device is invalid, reassembling the data packet based on the interconnection information, and the associated portions of the at least one set of low level data; and shifting the reassembled data packet through the JTAG boundary scan chain, thereby reloading the portion of at least one of sets of raw data into the plurality of interconnected programmable devices.

4. The method of configuring the plurality of similar interconnected programmable devices of claim 1 wherein the assembling a data packet comprises using a portion of the at least one set of low level data a plurality of times to form a plurality of portions of the data packet, thereby providing for shifting matching data into at least a subset of the plurality of similar programmable devices.

5. A method of configuring a plurality of similar programmable devices interconnected in a JTAG (Joint Test Action Group) boundary scan chain in a target system, the method comprising:

extracting at least one set of low level data from at least one high level configuration file, each high level configuration file and set of low level data being associated with at least one of the plurality of similar interconnected programmable devices included in the target system;

storing the at least one set of low level data in the target system;

encoding JTAG chain information describing interconnections between the interconnected devices of the plurality in a data packet assembly software module included in the target system;

assembling a data packet based on the encoded JTAG chain information and a portion of each of the at least one of set of low level data, and shifting each of the assembled data packets through the JTAG boundary scan chain, thereby loading the portions of low level data into associated ones of the interconnected programmable devices concurrently.

6. The method of claim 5 further comprising:

shifting data out of the plurality of interconnected devices over the JTAG (Joint Test Action Group) chain; and comparing the data from the plurality of interconnected devices with associated portions of the at least one of set of low level data to determine a validity of the data from the plurality of interconnected programmable devices.

7. The method of claim 6 further comprising:

if the data from the plurality of interconnected programmable device is invalid:

reassembling the data packet based on the JTAG (Joint Test Action Group) chain information, and the associated portions of the at least one set of low level data; and shifting the reassembled data packet through the JTAG boundary scan chain, thereby reloading the portion of the at least one of set of low level data into the plurality of interconnected programmable devices concurrently.

8. The method of claim 5 wherein the assembling a data packet comprises using a portion of the at least one of the at least one set of low level data a plurality of times to form a plurality of portions of the data packet, thereby providing for shifting matching data into a plurality of similar interconnected programmable devices concurrently.

9. A method of configuring a plurality of similar programmable devices interconnected in a JTAG (Joint Test Action Group) boundary scan chain in a target system, the method comprising:

extracting a first set of raw data from a first Serial Vector Format (SVF) file associated with a first programmable device;

extracting a plurality of sets of raw data from a plurality of Serial Vector Format (SVF) files associated with a plurality of programmable devices;

storing the first set of raw data in read only memory included in the target system;

storing the plurality of sets of raw data in read only memory included in the electronic device;

storing JTAG chain information describing the interconnections of the similar interconnected programmable devices;

reading the stored JTAG chain information;

reading a portion of the first set of raw data;

reading a portion of the each of the plurality of sets of raw data;

assembling a data packet based on the read JTAG chain information, and the portion of the first set of raw data and the portions of each of the plurality of sets of raw data; and shifting the assembled data packet through the JTAG (Joint Test Action Group) boundary scan chain, thereby loading the portion of the first set of raw data into at least one programmable device and loading the portions of each of the plurality of sets of raw data into respective interconnected programmable devices concurrently.

10. The method of claim 9 wherein storing JTAG (Joint Test Action Group) chain information comprises hard coding the JTAG chain information in device configuring software included in the electronic device.

11. The method of claim 9 wherein storing JTAG (Joint Test Action Group) chain information comprises storing the JTAG chain information in read only data memory included in the electronic device.

12. The method of claim 9 wherein extracting a first set of raw data from a first Serial Vector Format (SVF) file comprises:

creating a Xilinx Serial Vector Format (XSVF) file from the Serial Vector Format (SVF) file data; and extracting the raw data from the XSVF file.

13. The method of claim 9 further comprising:

shifting data out of the first devices over the JTAG (Joint Test Action Group) chain; and comparing the data from the first programmable device with respective portions of the stored first set of raw data to determine a validity of the data from the first programmable device.

14. The method of claim 13 further comprising:
if the data from the first device is invalid:
reassembling the data packet based on the read JTAG Joint Test Action Group) chain information, the respective portions of the first set of raw data; and
shifting the reassembled data packet through the JTAG boundary scan chain, thereby reloading the portion of the first set of raw data into the first programmable device.

15. A system useful for configuring a plurality of similar interconnected programmable devices in a target system, the system comprising:
means for extracting at least one set of low level data from at least one high level configuration file, each high level configuration file and set of low level data being associated with at least one of the plurality of similar interconnected programmable devices included in a target system;
means for storing the at least one set of low level data in the target system;
means for encoding interconnection information regarding the interconnected programmable devices in a data packet assembly software module included in the target system;
means for assembling a data packet based on the encoded interconnection information and a portion of each of the at least one of set of low level data; and,
means for shifting each of the assembled data packets through the interconnected devices, thereby loading the portions of low level data into associated programmable devices concurrently.

16. The system as set forth in claim 15 further comprising:
means for shifting data out of the plurality of interconnected devices; and
means for comparing the data from the plurality of interconnected devices with associated portions of the at least one set of low level data to determine a validity of the data from the plurality of interconnected programmable devices.

17. The system as set forth in claim 16 further comprising:
means for reassembling the data packet based on the interconnection information, and the associated portions of the at least one set of low level data; and
means for shifting the reassembled data packet through the JTAG (Joint Test Action Group) boundary scan chain, thereby reloading the portion of at least one of sets of low level data into the plurality of interconnected programmable devices if the data from the plurality of programmable device is invalid.

18. The system as set forth in claim 15 wherein the means for assembling a data packet uses a portion of the at least one set of low level data a plurality of times to form a plurality of portions of the data packet, thereby providing for shifting matching data into a plurality of similar interconnected programmable devices concurrently.

* * * * *